(12) United States Patent
Tochigi et al.

(10) Patent No.: US 12,336,312 B2
(45) Date of Patent: Jun. 17, 2025

(54) LIGHT RECEIVING ELEMENT AND ELECTRONIC APPARATUS

(71) Applicant: SONY SEMICONDUCTOR SOLUTIONS CORPORATION, Kanagawa (JP)

(72) Inventors: Yasuhisa Tochigi, Kanagawa (JP); Taiichiro Watanabe, Kanagawa (JP); Fumihiko Koga, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 89 days.

(21) Appl. No.: 18/038,355

(22) PCT Filed: Oct. 12, 2021

(86) PCT No.: PCT/JP2021/037642
§ 371 (c)(1),
(2) Date: May 23, 2023

(87) PCT Pub. No.: WO2022/118538
PCT Pub. Date: Jun. 9, 2022

(65) Prior Publication Data
US 2023/0420482 A1    Dec. 28, 2023

(30) Foreign Application Priority Data
Dec. 1, 2020   (JP) .................. 2020-199408

(51) Int. Cl.
*H04N 25/778*    (2023.01)
*H04N 25/78*     (2023.01)
(Continued)

(52) U.S. Cl.
CPC ....... *H10F 39/1843* (2025.01); *H04N 25/778* (2023.01); *H04N 25/78* (2023.01); *H10K 39/32* (2023.02)

(58) Field of Classification Search
None
See application file for complete search history.

(56) References Cited

U.S. PATENT DOCUMENTS

2002/0197462 A1*  12/2002  Forrest ................ H10K 30/57
                                                 313/523
2005/0104089 A1*   5/2005  Engelmann ............ H04N 23/11
                                                 257/E31.046
(Continued)

FOREIGN PATENT DOCUMENTS

JP    2019071580 A    5/2019
JP    2020043219 A    3/2020
(Continued)

OTHER PUBLICATIONS

International Search Report from corresponding PCT application PCT/JP2021/037642, dated Jan. 11, 2022.

*Primary Examiner* — Cynthia Segura
(74) *Attorney, Agent, or Firm* — K&L Gates LLP

(57) ABSTRACT

Provided are a light receiving element and an electronic apparatus that prevent generation of a false signal due to light emission caused by a circuit. The light receiving element includes a plurality of pixels. Each of the plurality of pixels includes: a photoelectric conversion layer that photoelectrically converts incident light; a signal reading circuit including an in-pixel transistor that is provided on a side opposite to a light incident side surface of the photoelectric conversion layer, amplifies signal charge generated by the photoelectric conversion layer, and reads the signal charge out of a pixel array; and a metal junction that bonds the photoelectric conversion layer and the signal reading circuit. The metal junction covers the in-pixel transistor when viewed from the light incident side surface of the photoelectric conversion layer.

11 Claims, 12 Drawing Sheets

(51) Int. Cl.
  *H10F 39/18* (2025.01)
  *H10K 39/32* (2023.01)

(56) References Cited

U.S. PATENT DOCUMENTS

| | | | |
|---|---|---|---|
| 2008/0156966 A1* | 7/2008 | Hsieh | H01L 27/14618 |
| | | | 257/292 |
| 2018/0329081 A1* | 11/2018 | Tokuda | G01T 7/00 |
| 2019/0222741 A1* | 7/2019 | Tsunai | H01L 27/146 |
| 2020/0152820 A1* | 5/2020 | Cao | H01L 21/02562 |
| 2020/0273896 A1* | 8/2020 | Innocent | H10F 39/80373 |
| 2020/0280694 A1 | 9/2020 | Morita et al. | |
| 2021/0217801 A1 | 7/2021 | Sugawa et al. | |
| 2021/0352801 A1 | 11/2021 | Miyamoto et al. | |
| 2022/0052083 A1 | 2/2022 | Tsukuda | |
| 2022/0124277 A1 | 4/2022 | Suzuki | |
| 2022/0417458 A1* | 12/2022 | Tashiro | H04N 25/77 |
| 2023/0094219 A1* | 3/2023 | Takatsuka | H04N 25/773 |
| | | | 257/292 |

FOREIGN PATENT DOCUMENTS

| | | | |
|---|---|---|---|
| WO | 2020039531 A1 | 2/2020 | |
| WO | 2020158401 A1 | 8/2020 | |
| WO | 2020184149 A1 | 9/2020 | |

\* cited by examiner

LIGHT RECEIVING ELEMENT AND ELECTRONIC APPARATUS

TECHNICAL FIELD

The technology (present technology) according to the present disclosure relates to a light receiving element and an electronic apparatus including the light receiving element.

BACKGROUND ART

In recent years, a light receiving element has been proposed in which indium gallium arsenide (InGaAs) having high sensitivity to near-infrared light is used for a photoelectric conversion film and each pixel is electrically connected (For example, Patent Document 1).

In the light receiving element described in Patent Document 1, a photodiode such as InGaAs that performs photoelectric conversion, a pulse detection circuit, and a signal reading circuit are connected, and the respective circuits simultaneously move.

CITATION LIST

Patent Document

Patent Document 1: US20160054434 A1

SUMMARY OF THE INVENTION

Problems to be Solved by the Invention

Incidentally, an amplifier circuit such as a capacitive trans impedance amplifier (CTIA) is mounted in the signal reading circuit of the light receiving element described above, and there is a concern about light at a near-infrared wavelength emitted an amplifier transistor and a current reduction transistor in particular. If the emitted light enters a photoelectric conversion unit having sensitivity particularly to near-infrared light, this leads to generation of a false signal, that is, noise.

The present disclosure has been made in view of such circumstances, and an object thereof is to provide a light receiving element and an electronic apparatus that prevent generation of a false signal due to light emission caused by a circuit.

Solutions to Problems

An aspect of the present disclosure is a light receiving element including a plurality of pixels, each of the plurality of pixels including: a photoelectric conversion layer that photoelectrically converts incident light; a signal reading circuit including an in-pixel transistor that is provided on a side opposite to a light incident side surface of the photoelectric conversion layer, amplifies signal charge generated by the photoelectric conversion layer, and reads the signal charge out of a pixel array; and a metal junction that bonds the photoelectric conversion layer and the signal reading circuit, the metal junction covering the in-pixel transistor when viewed from the light incident side surface of the photoelectric conversion layer.

Another aspect of the present disclosure is an electronic apparatus including a light receiving element including a plurality of pixels, each of the plurality of pixels including: a photoelectric conversion layer that photoelectrically converts incident light; a signal reading circuit including an in-pixel transistor that is provided on a side opposite to a light incident side surface of the photoelectric conversion layer, amplifies signal charge generated by the photoelectric conversion layer, and reads the signal charge out of a pixel array; and a metal junction that bonds the photoelectric conversion layer and the signal reading circuit, the metal junction covering the in-pixel transistor when viewed from the light incident side surface of the photoelectric conversion layer.

MODE FOR CARRYING OUT THE INVENTION

Hereinafter, embodiments of the present disclosure will be described with reference to the drawings. In the description of the drawings referred to in the following description, the same or similar parts are denoted by the same or similar reference signs, and redundant description is omitted. However, it should be noted that the drawings are schematic, and the relationship between the thickness and the plane dimension, the ratio of the thicknesses of the respective devices and the respective members, and the like are different from actual ones. Therefore, specific thicknesses and dimensions should be determined in consideration of the following description. Furthermore, it is needless to say that some of the dimensional relationships and ratios differ between the drawings.

Furthermore, the definitions of directions such as up and down in the following description are merely definitions for convenience of description, and do not limit the technical idea of the present disclosure. For example, it is a matter of course that when an object is observed by rotating the object by 90°, the upper and lower sides are converted into left and right and read as such, and when the object is observed by rotating the object by 180°, the upper and lower sides are inverted and read as such.

Note that the effects described in the present Description are illustrations only and not limited, and may have other effects.

First Embodiment (Entire Configuration of Solid-State Imaging Element)

Figure 1:
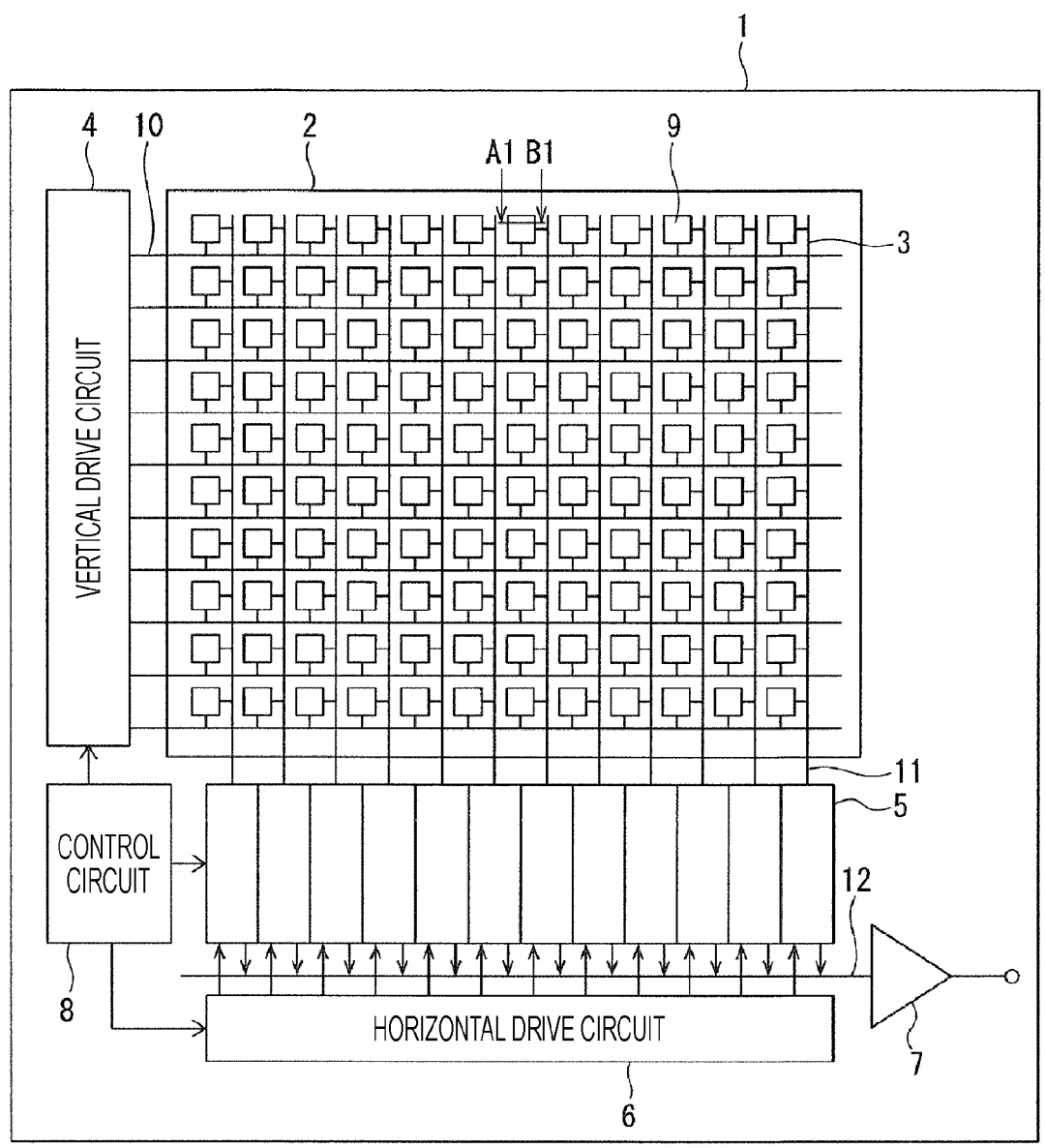
FIG. 1 is a schematic configuration diagram illustrating entirety of a solid-state imaging element according to a first embodiment of the present technology.

A solid-state imaging element 1 as a light receiving element according to a first embodiment of the present technology will be described. FIG. 1 is a schematic configuration diagram illustrating entirety of the solid-state imaging element 1 according to the first embodiment of the present technology.

The solid-state imaging element 1 in FIG. 1 is a back-illuminated complementary metal oxide semiconductor (CMOS) image sensor. The solid-state imaging element 1 captures image light from a subject via an optical lens, converts the amount of incident light an image of which is formed on an imaging surface into an electrical signal for each pixel, and outputs the electrical signal as a pixel signal.

As illustrated in FIG. 1, the solid-state imaging element 1 of the first embodiment includes a substrate 2, a pixel region 3, a vertical drive circuit 4, a column signal processing circuit 5, a horizontal drive circuit 6, an output circuit 7, and a control circuit 8.

The pixel region 3 has a plurality of pixels 9 regularly arranged in a two-dimensional array on the substrate 2.

The vertical drive circuit 4 includes, for example, a shift register, selects desired pixel drive wiring 10, supplies a pulse for driving the pixels 9 to the selected pixel drive wiring 10, and drives the pixels 9 row by row. That is, the vertical drive circuit 4 sequentially selects and scans the pixels 9 in the pixel region 3 row by row in the vertical direction, and supplies a pixel signal based on the signal charge generated according to the light reception amount in a photoelectric conversion unit of each pixel 9 through a vertical signal line 11 to the column signal processing circuit 5.

The column signal processing circuit 5 is disposed for example, for each column of the pixels 9, and performs a signal process such as noise reduction on a signal output from the pixel 9 in one row for each pixel column. For example, the column signal processing circuit 5 performs signal processes such as Correlated Double Sampling (CDS) for removing fixed pattern noise unique to the pixel, and Analog/Digital (A/D) conversion.

The horizontal drive circuit 6 includes, for example, a shift register, and sequentially outputs a horizontal scanning pulse to the column signal processing circuits 5 to select each of the column signal processing circuits 5 in order and to cause each of the column signal processing circuits 5 to output a pixel signal subjected to the signal processes to a horizontal signal line 12.

The output circuit 7 performs a signal process on the pixel signals sequentially supplied from the respective column signal processing circuits 5 through the horizontal signal line 12, and outputs the signals. As the signal process, for example, buffering, black level adjustment, column variation correction, various digital signal processes, and the like can be used.

On the basis of a vertical synchronizing signal, a horizontal synchronizing signal, and a master clock signal, the control circuit 8 generates a clock signal which serves as references for operation of the vertical drive circuit 4, the column signal processing circuit 5, the horizontal drive circuit 6, and the like and a control signal. Then, the control circuit 8 outputs the generated clock signal and control signal to the vertical drive circuit 4, the column signal processing circuit 5, the horizontal drive circuit 6, and the like.

(Equivalent Circuit of Pixel)

Figure 2:
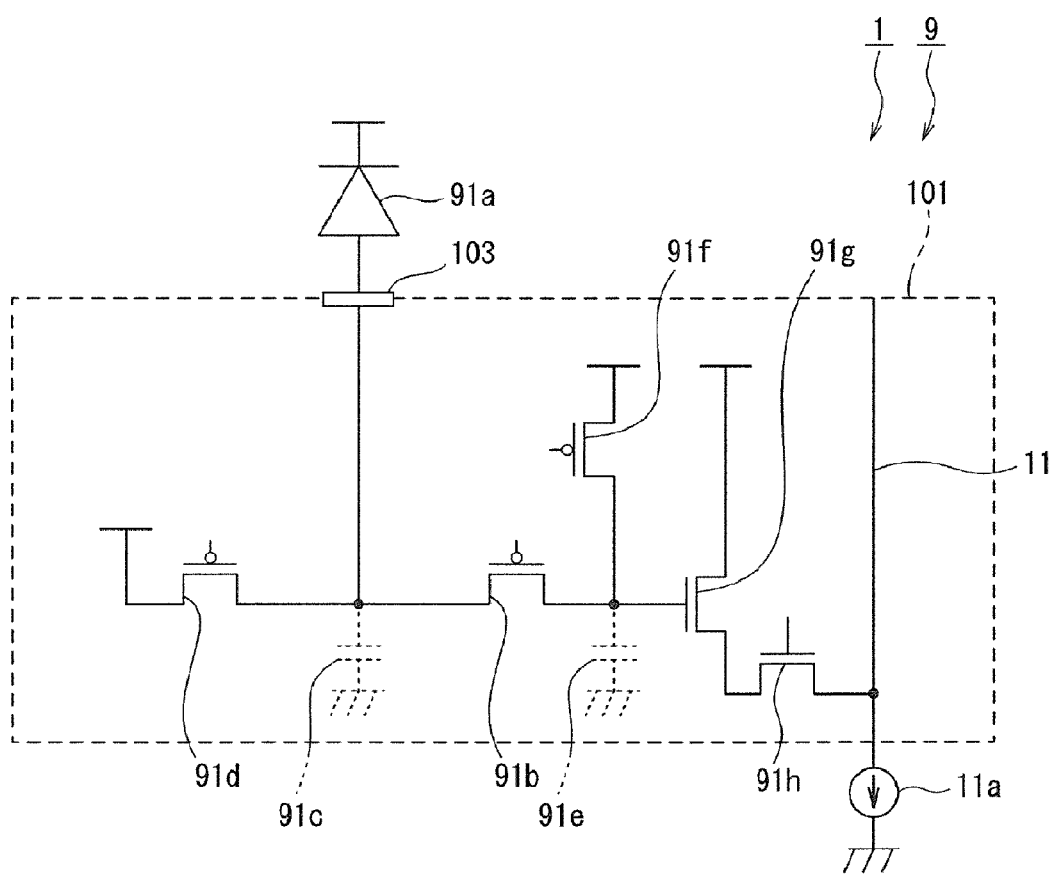
FIG. 2 is a circuit diagram illustrating an equivalent circuit of a pixel according to the first embodiment.

FIG. 2 illustrates an equivalent circuit of the pixel 9.

The pixel 9 includes a photodiode 91a, a transfer transistor 91b, a floating diffusion (FD) unit 91c, a discharge transistor 91d, an FD unit 91e, a reset transistor 91f, an amplifier transistor 91g, and a selection transistor 91h. The transfer transistor 91b, the discharge transistor 91d, the reset transistor 91f, the amplifier transistor 91g, and the selection transistor 91h are in-pixel transistors, and each of them includes, for example, a MOS transistor. Furthermore, the transfer transistor 91b, the FD unit 91c, the discharge transistor 91d, the FD unit 91e, the reset transistor 91f, the amplifier transistor 91g, and the selection transistor 91h constitute a signal reading circuit 101. Moreover, the FD unit 91e and the amplifier transistor 91g constitute an FD holding type amplifier circuit.

The photodiode 91a constitutes a photoelectric conversion layer (illustrated in FIG. 3) that photoelectrically converts incident light. The source of the transfer transistor 91b, the FD unit 91c, and the source of the discharge transistor 91d are connected to the anode of the photodiode 91a.

The drain of the transfer transistor 91b is connected to the FD unit 91e. The FD unit 91c accumulates the signal charge output from the photodiode 91a. The transfer transistor 91b transfers the signal charge accumulated in the FD unit 91c to the FD unit 91e on the basis of the transfer signal applied to the gate.

A power supply potential is applied to the drain of the discharge transistor 91d. The discharge transistor 91d discharges the signal charge output from the photodiode 91a on the basis of the discharge signal applied to the gate. The FD unit 91c is connected to the source of the reset transistor 91f. A power supply potential is applied to the drain of the reset transistor 91f. The reset transistor 91f initializes (resets) the signal charge accumulated in the FD unit 91e on the basis of the reset signal applied to the gate.

Furthermore, the gate of the amplifier transistor 91g is connected to the FD unit 91e. The source of the selection transistor 91h is connected to the drain of the amplifier transistor 91g. A power supply potential is applied to the source of the amplifier transistor 91g. The amplifier transistor 91g amplifies the potential of the FD unit 91e.

The drain of the selection transistor 91h is connected to the vertical signal line 11. The selection transistor 91h selects the pixel 9 on the basis of the selection signal applied to the gate. In a case where the pixel 9 is selected, a pixel signal corresponding to the potential amplified by the amplifier transistor 91g is output via the vertical signal line 11. A constant current source 11a is connected between the vertical signal line 11 and the ground. The constant current source 11a is a component that operates as a load of the amplifier transistor 91g.

(Cross-Sectional Structure of Pixel)

Figure 3:
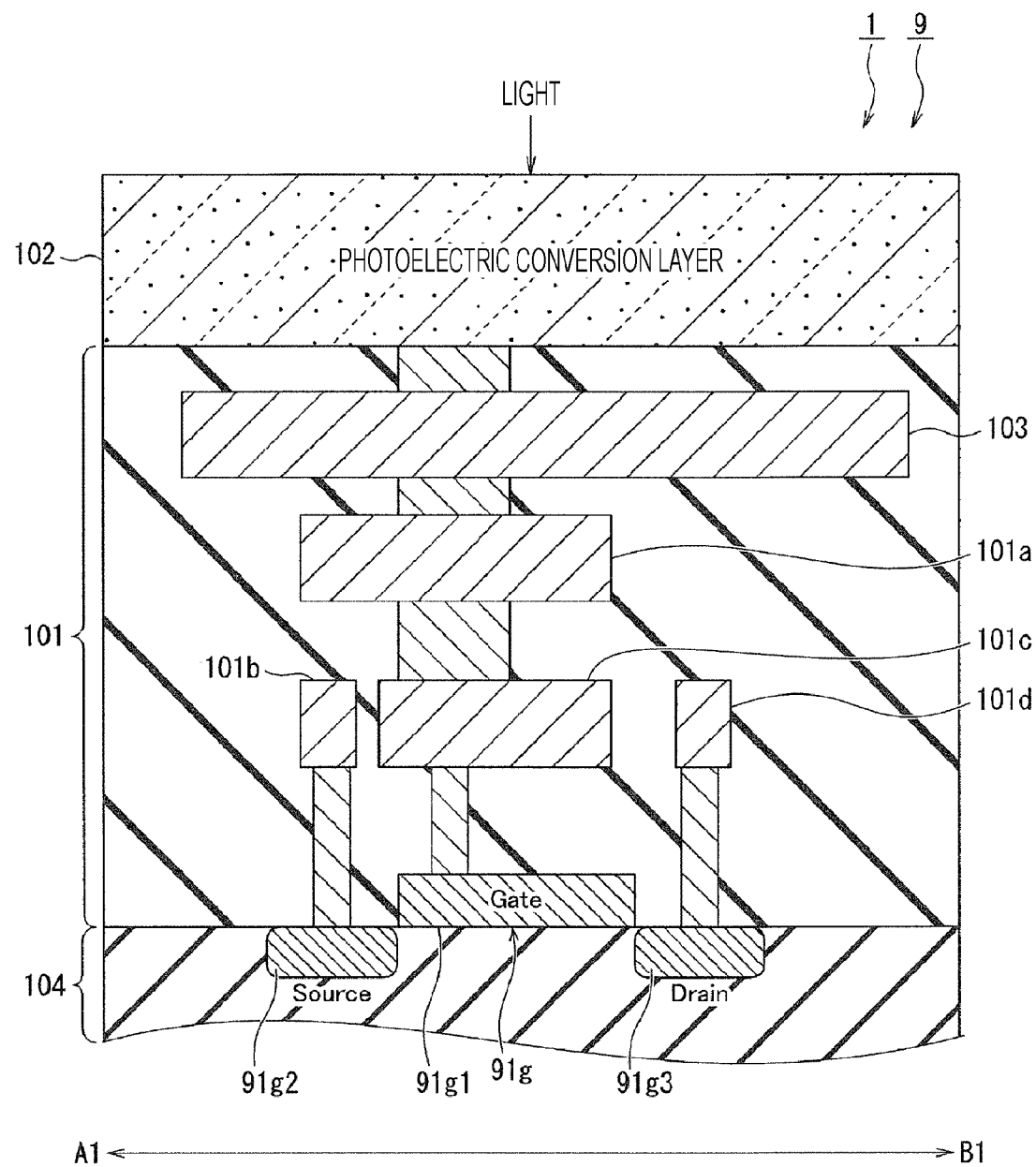
FIG. 3 is a cross-sectional view cut in the vertical direction along an arrow A1-B1 in FIG. 1 passing through the pixel according to the first embodiment.

FIG. 3 illustrates a cross-sectional view cut in the vertical direction along an arrow A1-B1 in FIG. 1 passing through the pixel 9. Hereinafter, a surface on a light incident surface side (upper side in FIG. 3) of each member of the solid-state imaging element 1 is referred to as a "back surface", and a surface on the side opposite to the light incident surface side (lower side in FIG. 3) is referred to as a "front surface".

In each pixel 9 of the solid-state imaging element 1, a photoelectric conversion layer 102 is stacked on the back surface side of the signal reading circuit 101. For example, a near-infrared color filter (not illustrated) and an on-chip lens (not illustrated) are stacked on the back surface side of the photoelectric conversion layer 102.

The photodiode 91a is formed in the photoelectric conversion layer 102. Furthermore, for example, indium gallium arsenide (InGaAs) is used for the photoelectric conversion layer 102. For example, indium gallium arsenide is a semiconductor having bandgap energy smaller than that of silicon (Si), and has light absorption sensitivity in a near-infrared light region on a longer wavelength side than a visible light region.

The signal reading circuit 101 and the photoelectric conversion layer 102 are Cu—Cu bonded by a copper (Cu) metal junction 103.

The signal reading circuit 101 includes the transfer transistor 91b, the FD unit 91c, the discharge transistor 91d, the FD unit 91e, the reset transistor 91f, the amplifier transistor 91g, the selection transistor 91h, and wiring 101a, 101b, 101c, and 101d stacked in a plurality of layers. In FIG. 3, for example, a gate electrode 91g1 of the amplifier transistor 91g is arranged on the front surface side of the signal reading circuit 101. The wiring 101a, 101b, 101c, and 101d is arranged on the back surface side of the amplifier transistor 91g. The transfer transistor 91b, the discharge transistor 91d, the reset transistor 91f, the amplifier transistor 91g, and the selection transistor 91h constituting each pixel 9 are driven via the plurality of layers of wiring 101a, 101b, 101c, and 101d formed in the signal reading circuit 101.

In a silicon substrate 104 on which the signal reading circuit 101 is formed, a source region 91g2 and a drain region 91g3 of the amplifier transistor 91g are formed.

In the solid-state imaging element 1 having the above configuration, light is emitted from the back surface side of the photoelectric conversion layer 102, and the transmitted light is photoelectrically converted by the photoelectric conversion layer 102, and therefore signal charge is generated. Then, the generated signal charge is output as a pixel signal through the vertical signal line 11 illustrated in FIG. 1 formed by the wiring 101a, 101b, 101c, and 101d via the transfer transistor 91b, the discharge transistor 91d, the reset transistor 91f, the amplifier transistor 91g, and the selection transistor 91h in the signal reading circuit 101.

Comparative Example of Embodiment

Figure 4:
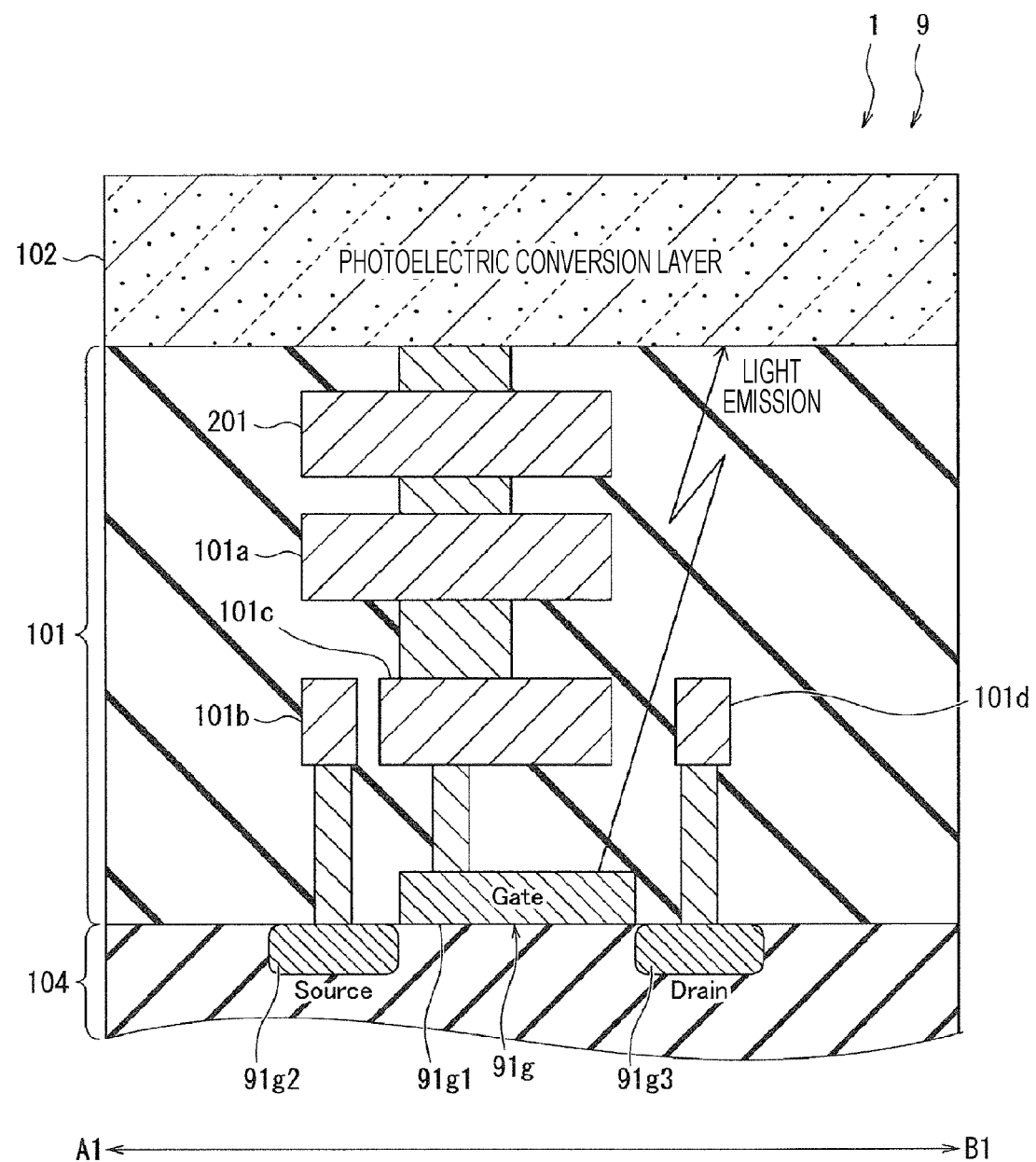
FIG. 4 is a cross-sectional view illustrating an example of a solid-state imaging element in a comparative example of the embodiment.

Incidentally, as illustrated in FIG. 4, there is a concern about light at a near-infrared wavelength emitted from an amplifier transistor 91g. If the emitted light enters a photoelectric conversion layer 102 having sensitivity particularly to near-infrared light, this leads to generation of a false signal, that is, noise.

FIG. 4 is a cross-sectional view illustrating an example of a solid-state imaging element 1 in a comparative example. In FIG. 4, the same portions as those in FIG. 3 described above are denoted by the same reference signs, and detailed description thereof will be omitted.

In the comparative example, a signal reading circuit 101 and the photoelectric conversion layer 102 are Cu—Cu bonded by a metal junction 201 smaller in size than the metal junction 103. Furthermore, in the comparative example, near-infrared light emitted from the amplifier transistor 91g is incident on the photoelectric conversion layer 102, which leads to generation of a false signal, that is, noise.

Solution of First Embodiment

Returning to FIG. 3, in the first embodiment of the present technology, when viewed from the light incident side surface of the photoelectric conversion layer 102, the gate electrode 91g1, the source region 91g2, and the drain region 91g3 of the amplifier transistor 91g are covered with the metal junction 103.

Therefore, since the light emitted from the amplifier transistor 91g is reflected by the metal junction 103 so as not to enter the photoelectric conversion layer 102, it is possible to prevent generation of a false signal due to the light emitted from the amplifier transistor 91g.

Operation and Effect of First Embodiment

As described above, according to the first embodiment, when viewed from the light incident side surface of the photoelectric conversion layer 102, the metal junction 103 covers the amplifier transistor 91g, and the light emitted from the amplifier transistor 91g is reflected by the metal junction 103 so as not to enter the photoelectric conversion layer 102. Therefore, generation of a false signal due to the light emitted from the amplifier transistor 91g can be prevented.

Second Embodiment

Next, a second embodiment will be described. The second embodiment is a modification of the first embodiment, and a case where a source-follower type amplifier circuit is used will be described.

Figure 5:
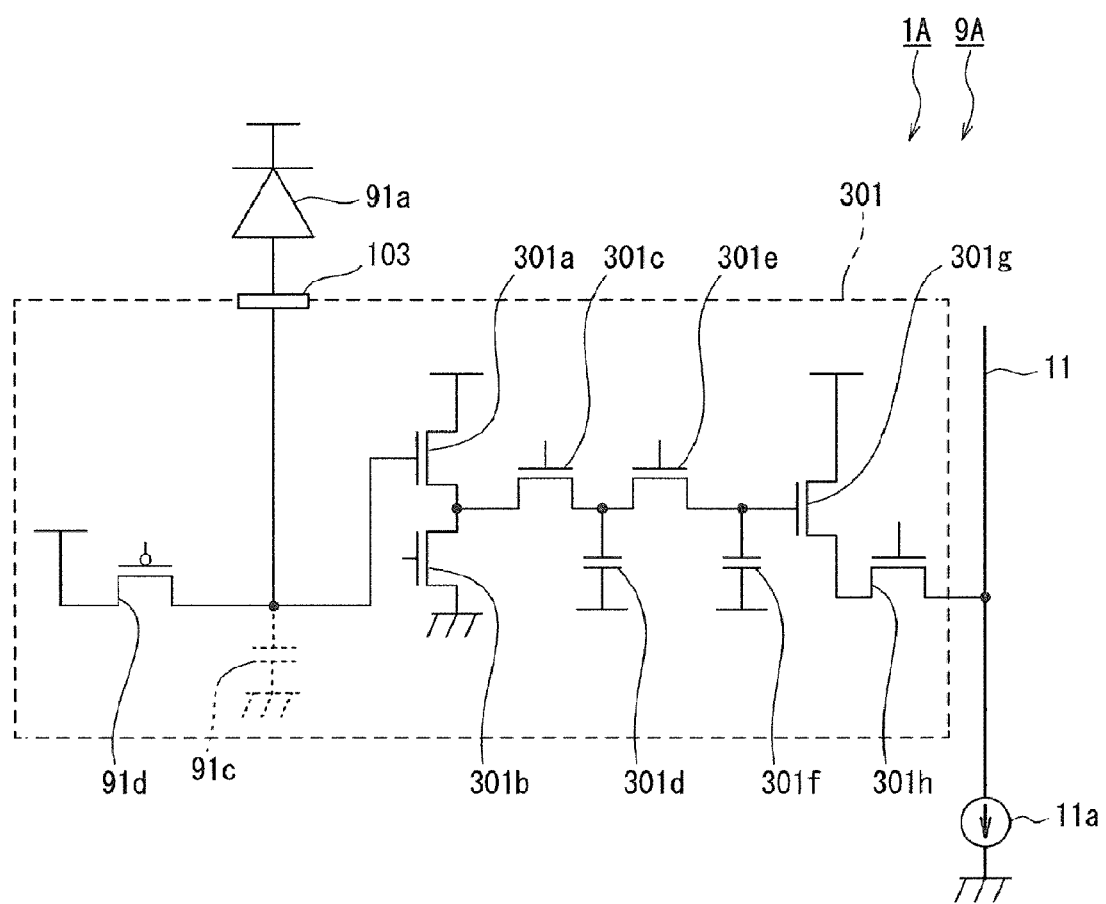
FIG. 5 is a circuit diagram illustrating an equivalent circuit of a pixel in a solid-state imaging element according to a second embodiment of the present technology.

FIG. 5 illustrates an equivalent circuit of a pixel 9A in a solid-state imaging element 1A according to the second embodiment. In FIG. 5, the same portions as those in FIG. 2 described above are denoted by the same reference signs, and detailed description thereof will be omitted.

A FD unit 91c, a discharge transistor 91d, an amplifier transistor 301a, a current source transistor 301b, a sampling transistor 301c, a capacitative element 301d, a sampling transistor 301e, a capacitative element 301f, an amplifier transistor 301g, and a selection transistor 301h constitute a signal reading circuit 301. Furthermore, the amplifier transistor 301a and the current source transistor 301b constitute a source-follower type amplifier circuit. Moreover, the sampling transistor 301c, the capacitative element 301d, the sampling transistor 301e, and the capacitative element 301f constitute a sample and hold circuit.

The FD unit 91c and the source of the discharge transistor 91d are connected to the anode of the photodiode 91a. The FD unit 91c accumulates the signal charge output from the photodiode 91a.

A power supply potential is applied to the drain of the discharge transistor 91d. The discharge transistor 91d discharges the signal charge accumulated in the FD unit 91c according to the discharge signal applied to the gate.

The FD unit 91c is connected to the gate of the amplifier transistor 301a. The source of the current source transistor 301b and the source of the sampling transistor 301c are connected to the drain of the amplifier transistor 301a. A power supply potential is applied to the source of the amplifier transistor 301a. The drain of the current source transistor 301b is grounded. The current source transistor 301b is a component that operates as a load of the amplifier transistor 301a. The source-follower type amplifier circuit including the amplifier transistor 301a and the current source transistor 301b operates as a source follower, and amplifies a difference between the potential of the FD unit 91c and the potential applied to the gate of the current source transistor 301b.

The capacitative element 301d and the source of the sampling transistor 301e are connected to the drain of the sampling transistor 301c. The capacitative element 301f and the gate of the amplifier transistor 301g are connected to the drain of the sampling transistor 301e. The sample and hold circuit samples the signal amplified by the source-follower type amplifier circuit on the basis of signals applied to the gate of the sampling transistor 301c and the gate of the sampling transistor 301e. That is, the sample and hold circuit outputs the sampling value according to the value of the signal amplified by the source-follower type amplifier circuit.

The source of the selection transistor 301h is connected to the drain of the amplifier transistor 301g. A power supply potential is applied to the source of the amplifier transistor 301g. The amplifier transistor 301g amplifies the sampling value of the sample and hold circuit.

The drain of the selection transistor 301h is connected to a vertical signal line 11. The selection transistor 301h selects a pixel 9 on the basis of a selection signal applied to the gate. In a case where the pixel 9 is selected, a pixel signal corresponding to the sampling value amplified by the amplifier transistor 301g is output via the vertical signal line 11. A constant current source 11a is connected between the vertical signal line 11 and the ground. The constant current source 11a is a component that operates as a load of the amplifier transistor 91g.

Incidentally, even in the second embodiment, there is a concern about light at a near-infrared wavelength emitted from the amplifier transistor 301a and the current source transistor 301b. If the emitted light enters a photoelectric conversion layer 102 having sensitivity particularly to near-infrared light, this leads to generation of a false signal, that is, noise.

Therefore, in the second embodiment of the present technology, when viewed from the light incident side surface of the photoelectric conversion layer 102, the amplifier transistor 301a and the current source transistor 301b are covered with a metal junction 103.

Therefore, since the light emitted from the amplifier transistor 301a and the current source transistor 301b is reflected by the metal junction 103 so as not to enter the photoelectric conversion layer 102, it is possible to prevent generation of a false signal due to the light emitted from the amplifier transistor 301a and the current source transistor 301b.

Operation and Effect of Second Embodiment

As described above, according to the second embodiment, when viewed from the light incident side surface of the photoelectric conversion layer 102, the metal junction 103 covers the amplifier transistor 301a and the current source transistor 301b, and the light emitted from the amplifier transistor 301a and the current source transistor 301b is reflected by the metal junction 103 so as not to enter the photoelectric conversion layer 102. Therefore, generation of a false signal due to the light emitted from the amplifier transistor 301a and the current source transistor 301b can be prevented.

Modified Example of Second Embodiment

Next, a modified example of the second embodiment will be described. The modified example of the second embodiment will describe a case where a sampling transistor and a capacitative element of a sample and hold circuit are provided in parallel.

Figure 6:
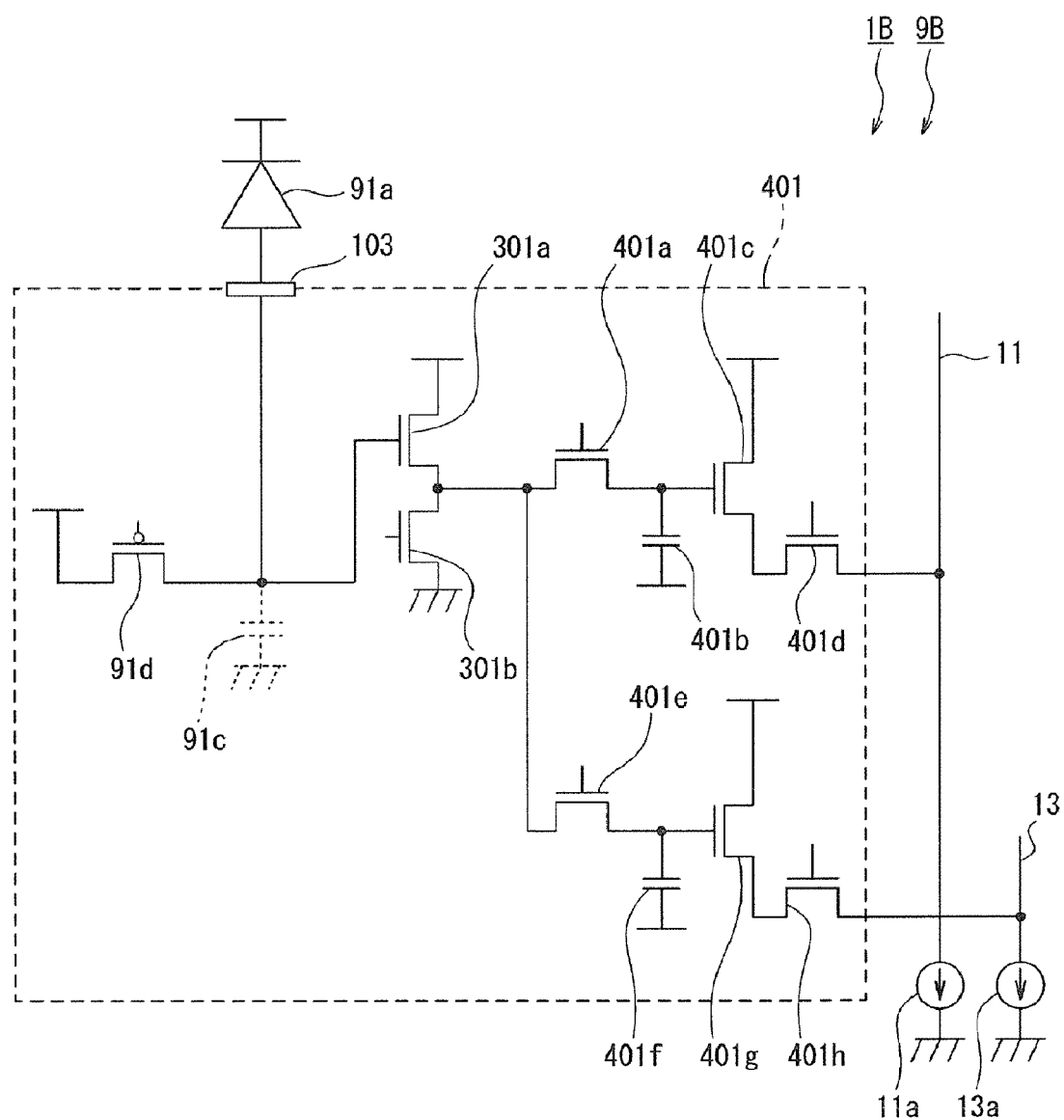
FIG. 6 is a circuit diagram illustrating an equivalent circuit of a pixel in a solid-state imaging element according to a modified example of the second embodiment of the present technology.

FIG. 6 illustrates an equivalent circuit of a pixel 9B in a solid-state imaging element 1B according to the modified example of the second embodiment. In FIG. 6, the same portions as those in FIG. 5 described above are denoted by the same reference signs, and detailed description thereof will be omitted.

A FD unit 91c, a discharge transistor 91d, an amplifier transistor 301a, a current source transistor 301b, a sampling transistor 401a, a capacitative element 401b, an amplifier transistor 401c, a selection transistor 401d, a sampling transistor 401e, a capacitative element 401f, an amplifier transistor 401g, and a selection transistor 401h constitute a signal reading circuit 401.

The source of the current source transistor 301b, the source of the sampling transistor 401a, and the source of the sampling transistor 401e are connected to the drain of the amplifier transistor 301a. A power supply potential is applied to the source of the amplifier transistor 301a. A source-follower type amplifier circuit including the amplifier transistor 301a and the current source transistor 301b operates as a source follower, and amplifies a difference between the potential of the FD unit 91e and the potential applied to the gate of the current source transistor 301b.

The capacitative element 401b and the gate of the amplifier transistor 401c are connected to the drain of the sampling transistor 401a. The sampling transistor 401a samples the signal amplified by the source-follower type amplifier circuit on the basis of the signal applied to the gate and accumulates the sampling value in the capacitative element 401b.

The source of the selection transistor 401d is connected to the drain of the amplifier transistor 401c. A power supply potential is applied to the source of the amplifier transistor 401c. The amplifier transistor 401c amplifies the sampling value.

The drain of the selection transistor 401d is connected to a vertical signal line 11. The selection transistor 401d selects a pixel 9 on the basis of the selection signal applied to the gate. In a case where the pixel 9 is selected, a pixel signal corresponding to the sampling value amplified by the amplifier transistor 401c is output via the vertical signal line 11. A constant current source 11a is connected between the vertical signal line 11 and the ground. The constant current source 11a is a component that operates as a load of the amplifier transistor 401c.

In contrast, the capacitative element 401f and the gate of the amplifier transistor 401g are connected to the drain of the sampling transistor 401e. The sampling transistor 401e samples the signal amplified by the source-follower type amplifier circuit on the basis of the signal applied to the gate and accumulates the sampling value in the capacitative element 401f.

The source of the selection transistor 401h is connected to the drain of the amplifier transistor 401g. A power supply potential is applied to the source of the amplifier transistor 401g. The amplifier transistor 401g amplifies the sampling value.

The drain of the selection transistor 401h is connected to a vertical signal line 13. The selection transistor 401h selects the pixel 9 on the basis of a selection signal applied to the gate. In a case where the pixel 9 is selected, a pixel signal corresponding to the sampling value amplified by the amplifier transistor 401g is output via the vertical signal line 13. A constant current source 13a is connected between the vertical signal line 13 and the ground. The constant current source 13a is a component that operates as a load of the amplifier transistor 401g.

Operation and Effect of Modified Example of Second Embodiment

As described above, also in the modified example of the second embodiment, when viewed from the light incident side surface of the photoelectric conversion layer 102, the amplifier transistor 301a and the current source transistor 301b are covered with the metal junction 103. Therefore, the operation and effect similar to those of the second embodiment described above can be obtained Third Embodiment Next, a third embodiment will be described. The third embodiment is a modification of the first embodiment, and a case where a capacitive trans impedance amplifier (CTIA) is used will be described.

Figure 7:
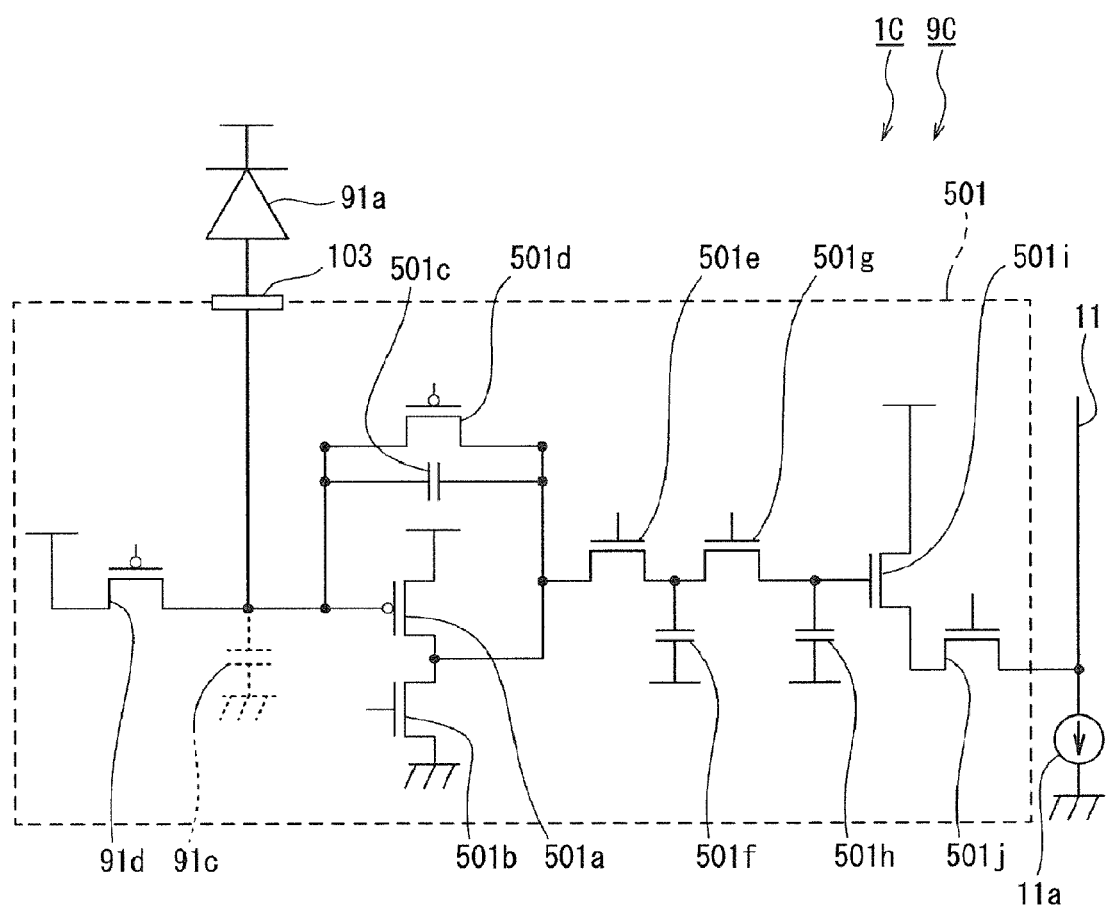
FIG. 7 is a circuit diagram illustrating an equivalent circuit of a pixel in a solid-state imaging element according to a third embodiment of the present technology.

FIG. 7 illustrates an equivalent circuit of a pixel 9C in a solid-state imaging element 1C according to the third embodiment. In FIG. 7, the same portions as those in FIG. 2 described above are denoted by the same reference signs, and detailed description thereof will be omitted.

A FD unit 91c, a discharge transistor 91d, an amplifier transistor 501a, a current source transistor 501b, a capacitive element 501c, a reset transistor 501d, a sampling transistor 501e, a capacitive element 501f, a sampling transistor 501g, a capacitive element 501h, an amplifier transistor 501i, and a selection transistor 501j constitute a signal reading circuit 501. Furthermore, the amplifier transistor 501a, the current source transistor 501b, the capacitive element 501c, and the reset transistor 501d constitute the CTIA. Moreover, the sampling transistor 501e, the capacitive element 501f, the sampling transistor 501g, and the capacitive element 501h constitute a sample and hold circuit.

The FD unit 91c and the source of the discharge transistor 91d are connected to the anode of the photodiode 91a. The FD unit 91c accumulates the signal charge output from the photodiode 91a.

A power supply potential is applied to the drain of the discharge transistor 91d. The discharge transistor 91d discharges the signal charge accumulated in the FD unit 91c according to the discharge signal applied to the gate.

The FD unit 91c is connected to the gate of the amplifier transistor 501a, the capacitive element 501c, and the source of the reset transistor 501d. The source of the current source transistor 501b, the capacitive element 501c, the drain of the reset transistor 501d, and the source of the sampling transistor 301c are connected to the drain of the amplifier transistor 501a. A power supply potential is applied to the source of the amplifier transistor 501a. The drain of the current source transistor 501b is grounded. The current source transistor 501b is a component that operates as a load of the amplifier transistor 501a. A source-follower type amplifier circuit including the amplifier transistor 501a and the current source transistor 501b operates as a source follower, and amplifies a difference between the potential of the FD unit 91c and the potential applied to the gate of the current source transistor 501b. The capacitive element 501c forms negative feedback with respect to the source-follower type amplifier circuit. Therefore, sensitivity regarding amplification by the source-follower type amplifier circuit can be increased.

Furthermore, the reset transistor 501d initializes (resets) the signal charge accumulated in the capacitive element 501c on the basis of a reset signal applied to the gate.

The capacitive element 501f and the source of the sampling transistor 501g are connected to the drain of the sampling transistor 501e. The capacitive element 501h and the gate of the amplifier transistor 501i are connected to the drain of the sampling transistor 501g. The sample and hold circuit samples the amplified signal on the basis of signals applied to the gate of the sampling transistor 501e and the gate of the sampling transistor 501g. That is, the sample and hold circuit outputs the sampling value according to the value of the amplified signal.

The source of the selection transistor 501j is connected to the drain of the amplifier transistor 501i. A power supply potential is applied to the source of the amplifier transistor 501i. The amplifier transistor 501i amplifies the sampling value of the sample and hold circuit.

The drain of the selection transistor 501j is connected to a vertical signal line 11. The selection transistor 501j selects a pixel 9 on the basis of the selection signal applied to the gate. In a case where the pixel 9 is selected, a pixel signal corresponding to the sampling value amplified by the amplifier transistor 501i is output via the vertical signal line 11. A constant current source 11a is connected between the vertical signal line 11 and the ground. The constant current source 11a is a component that operates as a load of the amplifier transistor 91g.

Incidentally, even in the third embodiment, there is a concern about light at a near-infrared wavelength emitted from the amplifier transistor 501a and the current source transistor 501b. If the emitted light enters a photoelectric conversion layer 102 having sensitivity particularly to near-infrared light, this leads to generation of a false signal, that is, noise.

Therefore, in the third embodiment of the present technology, when viewed from the light incident side surface of the photoelectric conversion layer 102, the amplifier transistor 501a and the current source transistor 501b are covered with a metal junction 103.

Therefore, since light emitted from the amplifier transistor 501a and the current source transistor 501b is reflected by the metal junction 103 so as not to enter the photoelectric conversion layer 102, it is possible to prevent generation of a false signal due to the light emitted from the amplifier transistor 501a and the current source transistor 501b.

Operation and Effect of Third Embodiment

As described above, according to the third embodiment, when viewed from the light incident side surface of the photoelectric conversion layer 102, the metal junction 103 covers the amplifier transistor 501a and the current source transistor 501b, and the light emitted from the amplifier transistor 501a and the current source transistor 501b is reflected by the metal junction 103 so as not to enter the photoelectric conversion layer 102. Therefore, generation of a false signal due to the light emitted from the amplifier transistor 501*a* and the current source transistor 501*b* can be prevented.

Modified Example of Third Embodiment

Next, a modified example of the third embodiment will be described. The modified example of the third embodiment will describe a case where a sampling transistor and a capacitative element of a sample and hold circuit are provided in parallel.

Figure 8:
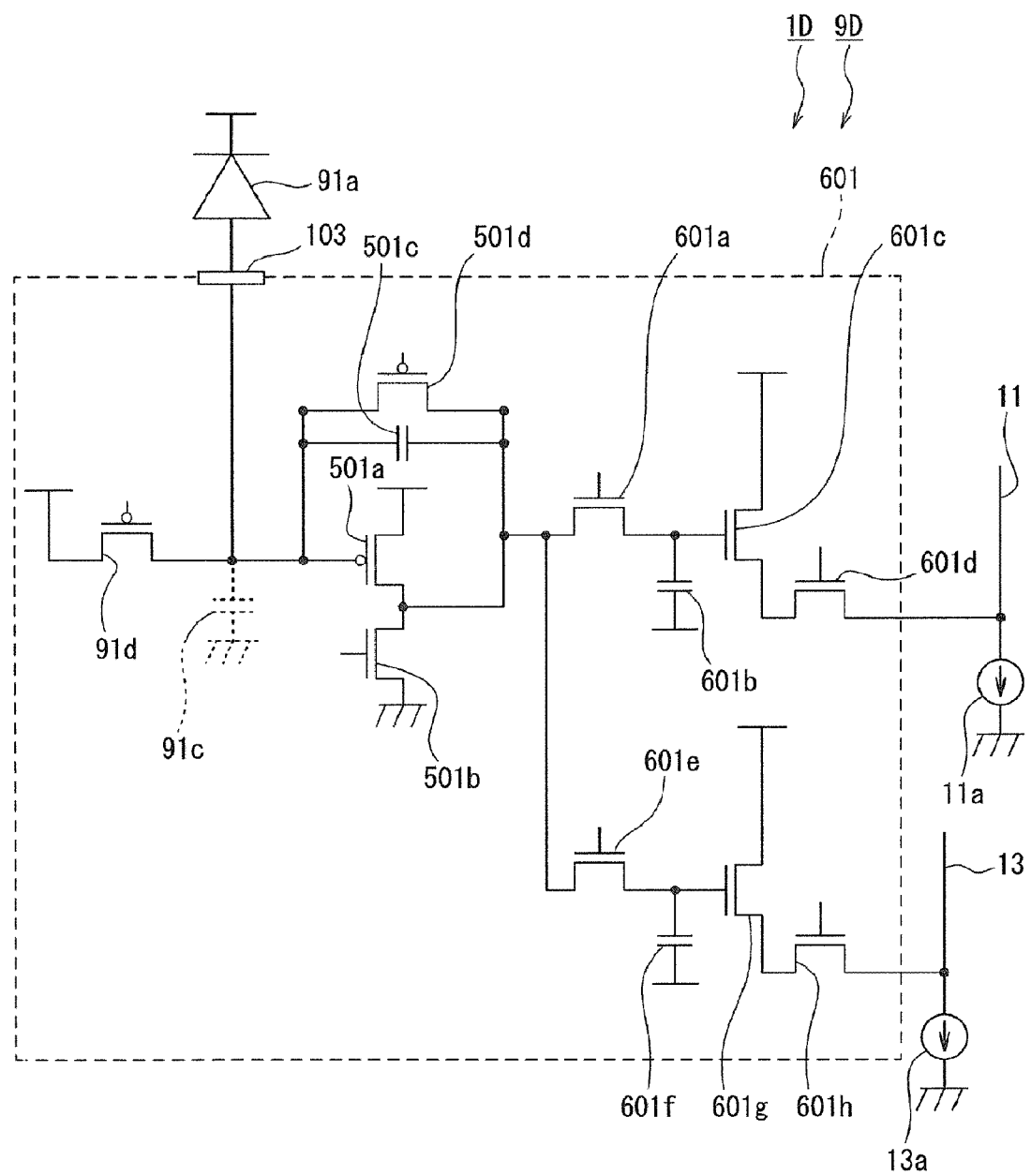
FIG. 8 is a circuit diagram illustrating an equivalent circuit of a pixel in a solid-state imaging element according to a modified example of the third embodiment of the present technology.

FIG. 8 illustrates an equivalent circuit of a pixel 9D in a solid-state imaging element 1D according to the modified example of the third embodiment. In FIG. 8, the same portions as those in FIG. 7 described above are denoted by the same reference signs, and detailed description thereof will be omitted.

A FD unit 91*c*, a discharge transistor 91*d*, an amplifier transistor 501*a*, a current source transistor 501*b*, a capacitative element 501*c*, a reset transistor 501*d*, a sampling transistor 601*a*, a capacitative element 601*b*, an amplifier transistor 601*c*, a selection transistor 601*d*, a sampling transistor 601*e*, a capacitative element 601*f*, an amplifier transistor 601*g*, and a selection transistor 601*h* constitute a signal reading circuit 601.

The source of the current source transistor 501*b*, the capacitative element 501*c*, the drain of the reset transistor 501*d*, the source of the sampling transistor 601*a*, and the source of the sampling transistor 601*e* are connected to the drain of the amplifier transistor 501*a*.

The capacitative element 601*b* and the gate of the amplifier transistor 601*c* are connected to the drain of the sampling transistor 601*a*. The sampling transistor 601*a* samples the signal amplified by a CTIA on the basis of the signal applied to the gate and accumulates the sampling value in the capacitative element 601*b*.

The source of the selection transistor 601*d* is connected to the drain of the amplifier transistor 601*c*. A power supply potential is applied to the source of the amplifier transistor 601*c*. The amplifier transistor 601*c* amplifies the sampling value.

The drain of the selection transistor 601*d* is connected to a vertical signal line 11. The selection transistor 601*d* selects a pixel 9 on the basis of the selection signal applied to the gate. In a case where the pixel 9 is selected, a pixel signal corresponding to the sampling value amplified by the amplifier transistor 601*c* is output via the vertical signal line 11. A constant current source 11*a* is connected between the vertical signal line 11 and the ground. The constant current source 11*a* is a component that operates as a load of the amplifier transistor 601*c*.

In contrast, the capacitative element 601*f* and the gate of the amplifier transistor 601*g* are connected to the drain of the sampling transistor 601*e*. The sampling transistor 601*e* samples the signal amplified by a source-follower type amplifier circuit on the basis of the signal applied to the gate and accumulates the sampling value in the capacitative element 601*f*.

The source of the selection transistor 601*h* is connected to the drain of the amplifier transistor 601*g*. A power supply potential is applied to the source of the amplifier transistor 601*g*. The amplifier transistor 601*g* amplifies the sampling value.

The drain of the selection transistor 601*h* is connected to a vertical signal line 13. The selection transistor 601*h* selects the pixel 9 on the basis of the selection signal applied to the gate. In a case where the pixel 9 is selected, a pixel signal corresponding to the sampling value amplified by the amplifier transistor 601*g* is output via the vertical signal line 13. A constant current source 13*a* is connected between the vertical signal line 13 and the ground. The constant current source 13*a* is a component that operates as a load of the amplifier transistor 601*g*.

Operation and Effect of Modified Example of Third Embodiment

As described above, also in the modified example of the third embodiment, when viewed from the light incident side surface of a photoelectric conversion layer 102, the amplifier transistor 501*a* and the current source transistor 501*b* are covered with a metal junction 103. Therefore, the operation and effect similar to those of the third embodiment described above can be obtained Fourth Embodiment Next, a fourth embodiment will be described. The fourth embodiment is a modification of the first embodiment, and a case where a bump is used for a metal junction will be described.

Figure 9:
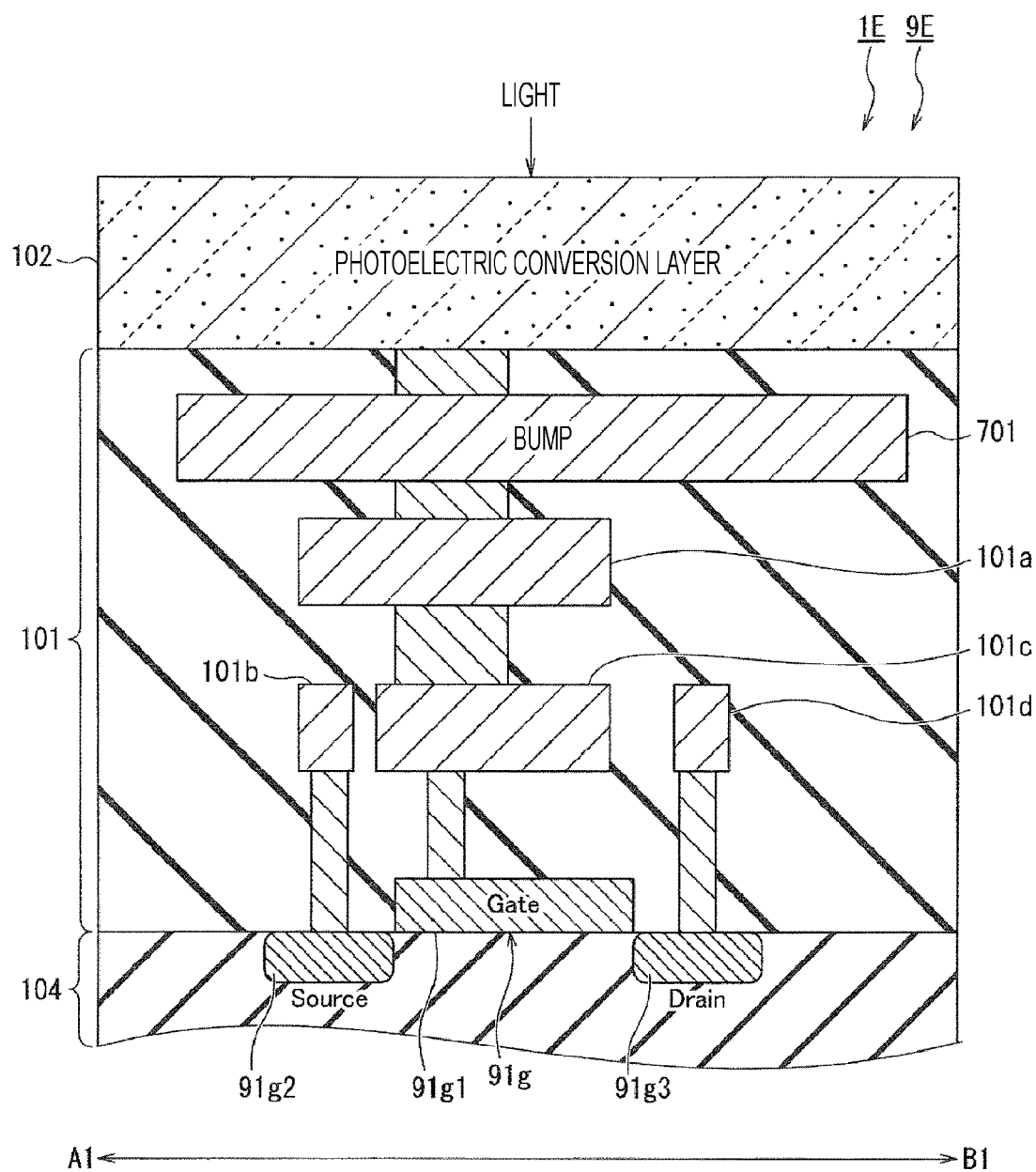
FIG. 9 is a view illustrating a cross-section of a pixel in a solid-state imaging element according to a fourth embodiment of the present technology.

FIG. 9 illustrates a cross section of a pixel 9E in a solid-state imaging element 1E according to the fourth embodiment. In FIG. 9, the same portions as those in FIG. 3 described above are denoted by the same reference signs, and detailed description thereof will be omitted.

A signal reading circuit 101 and a photoelectric conversion layer 102 are bonded by a bump 701. In the fourth embodiment of the present technology, when viewed from the light incident side surface of the photoelectric conversion layer 102, an amplifier transistor 91*g* is covered with the bump 701.

Therefore, since the light emitted from the amplifier transistor 91*g* is reflected by the bump 701 so as not to enter the photoelectric conversion layer 102, it is possible to prevent generation of a false signal due to the light emitted from the amplifier transistor 91*g*.

Operation and Effect of Fourth Embodiment

As described above, according to the fourth embodiment, when viewed from the light incident side surface of the photoelectric conversion layer 102, the bump 701 covers the amplifier transistor 91*g*, and the light emitted from the amplifier transistor 91*g* is reflected by the bump 701 so as not to enter the photoelectric conversion layer 102. Therefore, generation of a false signal due to the light emitted from the amplifier transistor 91*g* can be prevented.

Fifth Embodiment

Next, a fifth embodiment will be described. The fifth embodiment is a modification of the first embodiment, and a case where an organic film is used for a photoelectric conversion layer will be described.

Figure 10:
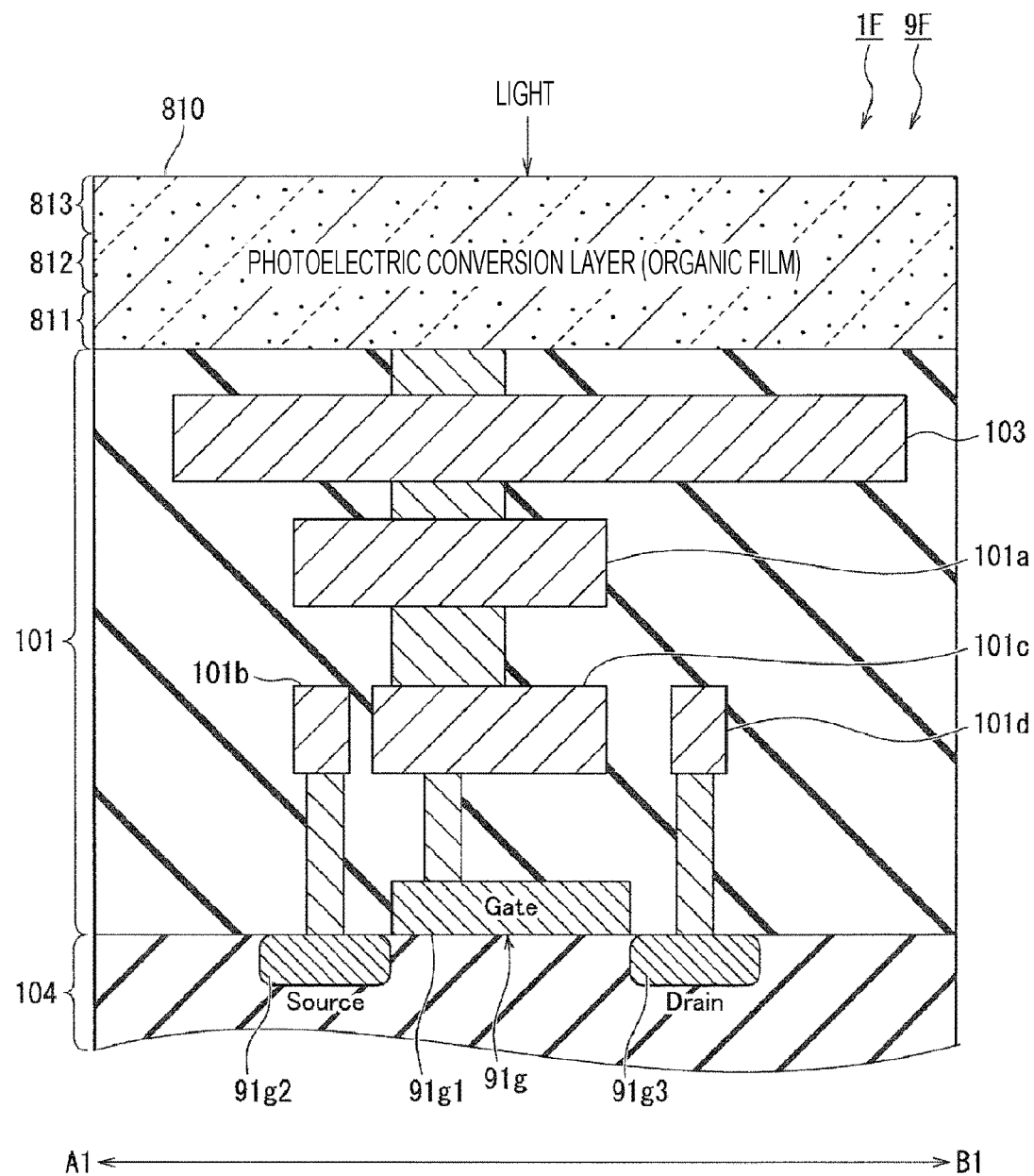
FIG. 10 is a view illustrating a cross-section of a pixel in a solid-state imaging element according to a fifth embodiment of the present technology.

FIG. 10 illustrates a cross section of a pixel 9F in a solid-state imaging element 1F according to the fifth embodiment. In FIG. 10, the same portions as those in FIG. 3 described above are denoted by the same reference signs, and detailed description thereof will be omitted.

A signal reading circuit 101 and a photoelectric conversion layer 810 of an organic film are Cu—Cu bonded by a copper (Cu) metal junction 103.

In the photoelectric conversion layer 810 of the organic film, an organic photoelectric conversion film 811 having sensitivity to blue light (B), an organic photoelectric conversion film 812 having sensitivity to green light (G), and an organic photoelectric conversion film 813 having sensitivity to red light (R) are sequentially stacked. In the photoelectric conversion layer 810, B/G/R signals are separately extracted from the pixel 9F, and therefore sensitivity is improved. Examples of the organic semiconductor material contained in the photoelectric conversion layer 810 include quinacridone, chlorinated boron subphthalocyanine, pentacene, benzothienobenzothiophene, fullerene, and derivatives thereof.

In the fifth embodiment of the present technology, when viewed from the light incident side surface of the photoelectric conversion layer 810, a gate electrode 91g1, a source region 91g2, and a drain region 91g3 of an amplifier transistor 91g are covered with a metal junction 103.

Therefore, since the light emitted from the amplifier transistor 91g is reflected by the metal junction 103 so as not to enter the photoelectric conversion layer 810, it is possible to prevent generation of a false signal due to the light emitted from the amplifier transistor 91g.

Operation and Effect of Fifth Embodiment

As described above, according to the fifth embodiment, the operation and effect similar to those of the first embodiment described above can be obtained.

Sixth Embodiment

Next, a sixth embodiment will be described. The sixth embodiment is a modification of the first embodiment, and a case where silicon (Si) is used for a photoelectric conversion layer will be described.

Figure 11:
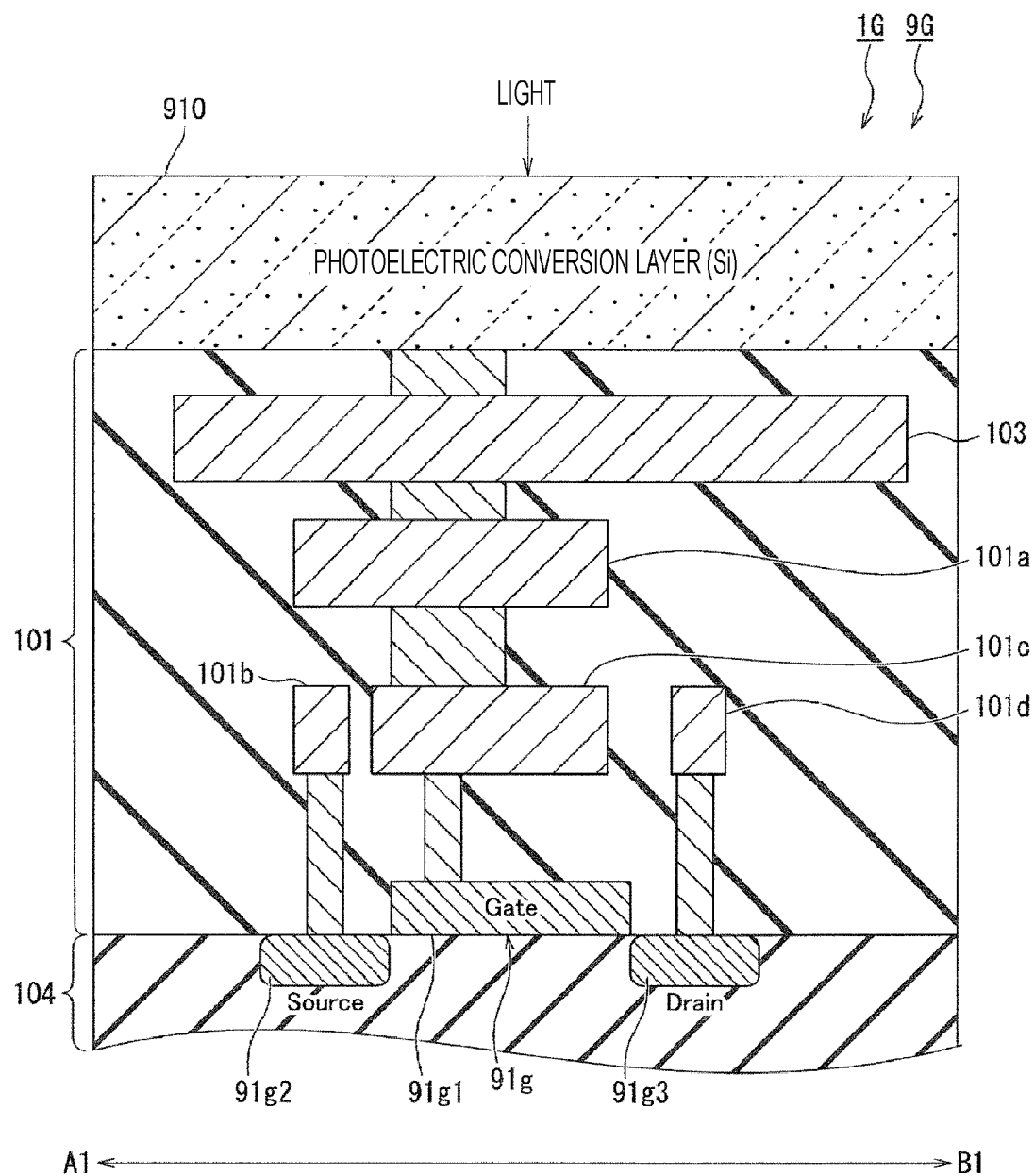
FIG. 11 is a view illustrating a cross-section of a pixel in a solid-state imaging element according to a sixth embodiment of the present technology.

FIG. 11 illustrates a cross section of a pixel 9G in a solid-state imaging element 1G according to the sixth embodiment. In FIG. 11, the same portions as those in FIG. 3 described above are denoted by the same reference signs, and detailed description thereof will be omitted.

A signal reading circuit 101 and a silicon photoelectric conversion layer 910 are Cu—Cu bonded by a copper (Cu) metal junction 103.

In the sixth embodiment of the present technology, when viewed from the light incident side surface of the photoelectric conversion layer 910, a gate electrode 91g1, a source region 91g2, and a drain region 91g3 of an amplifier transistor 91g are covered with the metal junction 103.

Therefore, since the light emitted from the amplifier transistor 91g is reflected by the metal junction 103 so as not to enter the photoelectric conversion layer 910, it is possible to prevent generation of a false signal due to the light emitted from the amplifier transistor 91g.

Note that even a photoelectric conversion layer using germanium instead of silicon is similar.

Operation and Effect of Sixth Embodiment

As described above, according to the sixth embodiment, the operation and effect similar to those of the first embodiment can be obtained.

Other Embodiments

As described above, the present technology has been described by the first to sixth embodiments, the modified example of the second embodiment, and the modified example of the third embodiment; however, it should not be understood that the description and the drawings constituting a part of this disclosure limit the present technology. It will be apparent to those skilled in the art that various alternative embodiments, examples, and operation technologies can be included in the present technology if those skilled in the art understand the spirit of the technical contents disclosed in the first to sixth embodiments described above. Furthermore, the configurations disclosed in the first to sixth embodiments, the modified example of the second embodiment, and the modified example of the third embodiment can be appropriately combined within a range in which no contradiction occurs. For example, configurations disclosed by a plurality of different embodiments may be combined, or configurations disclosed by a plurality of different modified examples of the same embodiment may be combined.

Application Example to Electronic Apparatus

Figure 12:
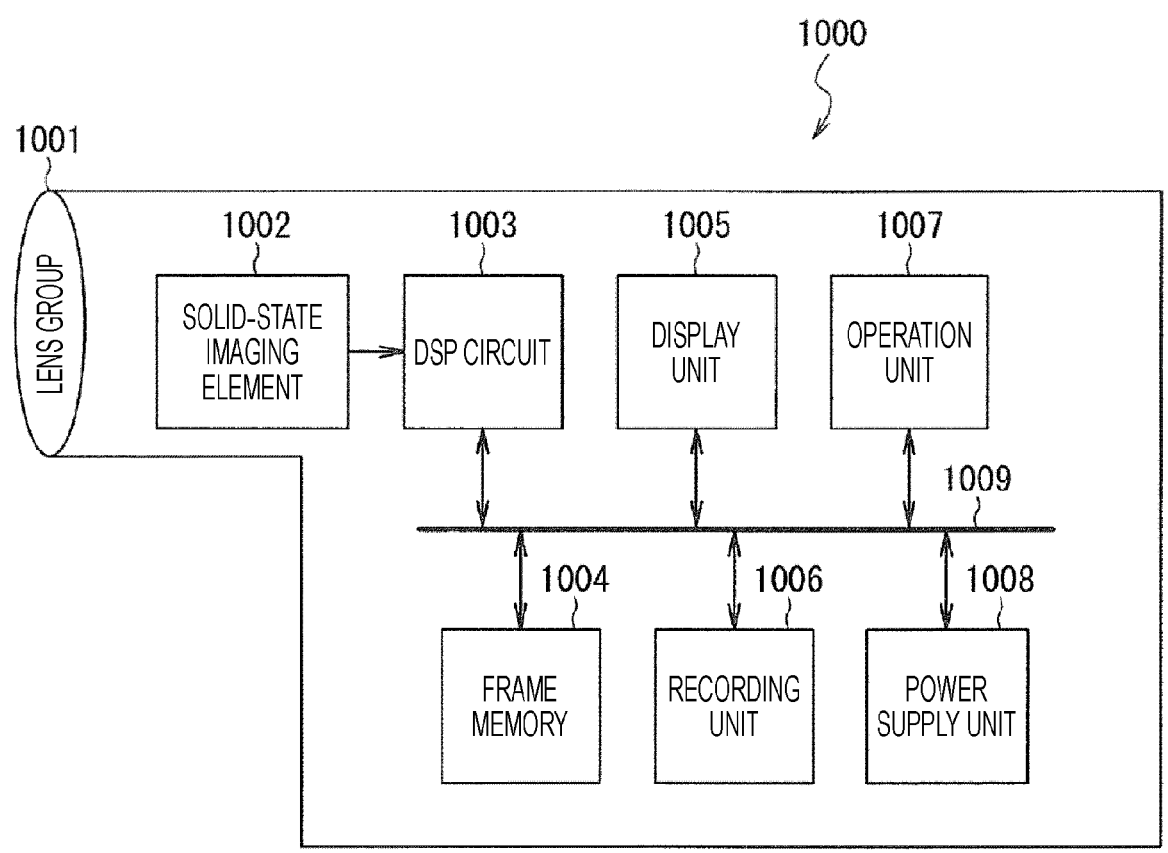
FIG. 12 is a block diagram illustrating a configuration example of an embodiment of an imaging device as an electronic apparatus to which the present technology is applied.

FIG. 12 is a block diagram illustrating a configuration example of an embodiment of an imaging device as an electronic apparatus to which the present technology is applied.

An imaging device 1000 in FIG. 12 is a video camera, a digital still camera, or the like. The imaging device 1000 includes a lens group 1001, a solid-state imaging element 1002, a DSP circuit 1003, a frame memory 1004, a display unit 1005, a recording unit 1006, an operation unit 1007, and a power supply unit 1008. The DSP circuit 1003, the frame memory 1004, the display unit 1005, the recording unit 1006, the operation unit 1007, and the power supply unit 1008 are connected to one another via a bus line 1009.

The lens group 1001 captures incident light (image light) from a subject and forms an image on an imaging surface of the solid-state imaging element 1002. The solid-state imaging element 1002 includes the first to sixth embodiments of the solid-state imaging device described above. The solid-state imaging element 1002 converts the amount of the incident light an image of which is formed on the imaging surface by the lens group 1001 into an electric signal for each pixel, and supplies the electrical signal to the DSP circuit 1003 as a pixel signal.

The DSP circuit 1003 performs a predetermined image process on the pixel signal supplied from the solid-state imaging element 1002, supplies the image signal subjected to the image process to the frame memory 1004 in units of frames, and temporarily stores the image signal.

The display unit 1005 includes, for example, a panel type display device such as a liquid crystal panel or an organic electro luminescence (EL) panel, and displays an image on the basis of the pixel signal in units of frames temporarily stored in the frame memory 1004.

The recording unit 1006 includes a digital versatile disk (DVD), a flash memory, or the like, and reads and records the pixel signal in units of frames temporarily stored in the frame memory 1004.

The operation unit 1007 issues operation commands for various functions of the imaging device 1000 under operation by the user. The power supply unit 1008 appropriately supplies power to the DSP circuit 1003, the frame memory 1004, the display unit 1005, the recording unit 1006, and the operation unit 1007.

It is sufficient if the electronic apparatus to which the present technology is applied is a device using a light receiving element for an image capturing unit (photoelectric conversion unit), and examples thereof include a mobile terminal device having an imaging function and a copying machine using a photodetection device for an image reading unit, in addition to the imaging device 1000.

Note that the present disclosure can also be configured as follows.

(1)

A light receiving element including a plurality of pixels, each of the plurality of pixels including:
a photoelectric conversion layer that photoelectrically converts incident light;
a signal reading circuit including an in-pixel transistor that is provided on a side opposite to a light incident side surface of the photoelectric conversion layer, amplifies signal charge generated by the photoelectric conversion layer, and reads the signal charge out of a pixel array; and
a metal junction that bonds the photoelectric conversion layer and the signal reading circuit,
the metal junction covering the in-pixel transistor when viewed from the light incident side surface of the photoelectric conversion layer.

(2)

The light receiving element according to the (1), in which the photoelectric conversion layer includes indium gallium arsenide (InGaAs).

(3)

The light receiving element according to the (1), in which the photoelectric conversion layer includes an organic film.

(4)

The light receiving element according to the (1), in which the photoelectric conversion layer includes germanium.

(5)

The light receiving element according to the (1), in which the photoelectric conversion layer includes silicon.

(6)

The light receiving element according to the (1),
in which the signal reading circuit includes a floating diffusion (FD) unit that accumulates signal charge generated by the photoelectric conversion layer, and
the in-pixel transistor includes an amplifier transistor that amplifies a potential corresponding to an amount of signal charge accumulated in the FD unit and outputs a pixel signal corresponding to the potential that has been amplified.

(7)

The light receiving element according to the (1), in which the in-pixel transistor further includes an amplifier transistor that amplifies a potential corresponding to an amount of signal charge generated by the photoelectric conversion layer and outputs a pixel signal corresponding to the potential that has been amplified, and a current source transistor that is connected between the amplifier transistor and ground, and the amplifier transistor and the current source transistor constitute a source follower amplifier circuit.

(8)

The light receiving element according to the (1), in which the in-pixel transistor constitutes a capacitive trans impedance amplifier (CTIA).

(9)

The light receiving element according to the (1), in which the metal junction includes Cu—Cu bonding.

(10)

The light receiving element according to the (1), in which the metal junction includes a bump.

(11)

An electronic apparatus including a light receiving element including a plurality of pixels,
each of the plurality of pixels including:
a photoelectric conversion layer that photoelectrically converts incident light;
a signal reading circuit including an in-pixel transistor that is provided on a side opposite to a light incident side surface of the photoelectric conversion layer, amplifies signal charge generated by the photoelectric conversion layer, and reads the signal charge out of a pixel array; and
a metal junction that bonds the photoelectric conversion layer and the signal reading circuit,
the metal junction covering the in-pixel transistor when viewed from the light incident side surface of the photoelectric conversion layer.

REFERENCE SIGNS LIST 1, 1A, 1B, 1C, 1D, 1E, 1F, 1G Solid-state imaging element
2 Substrate
3 Pixel region
4 Vertical drive circuit
5 Column signal processing circuit
6 Horizontal drive circuit
7 Output circuit
8 Control circuit
9, 9A, 9B, 9C, 9D, 9E, 9F, 9G Pixel
10 Pixel drive wiring
11, 13 Vertical signal line
11a, 13a Constant current source
12 Horizontal signal line
91a Photodiode
91b Transfer transistor
91c, 91e FD unit
91d Discharge transistor
91f, 501d Reset transistor
91g, 301a, 301g, 401c, 401g, 501a, 501i, 601c, 601g Amplifier transistor
91g1 Gate electrode
91g2 Source region
91g3 Drain region
91h, 301h, 401d, 401h, 501j, 601d, 601h Selection transistor
101, 301, 401, 501, 601 Signal reading circuit
101a, 101b, 101c, 101d Wiring
102, 810, 910 Photoelectric conversion layer
103, 201 Metal junction
104 Silicon substrate
301b, 501b Current source transistor
301c, 301e, 401a, 401e, 501e, 501g, 601a, 601e Sampling transistor
301d, 301f, 401b, 401f, 501c, 501f, 501h, 601b, 601f Capacitative element
701 Bump
811, 812, 813 Organic photoelectric conversion film
1000 Imaging device
1001 Lens group
1002 Solid-state imaging element
1003 DSP circuit
1004 Frame memory
1005 Display unit
1006 Recording unit
1007 Operation unit
1008 Power supply unit
1009 Bus line

The invention claimed is:

1. A light receiving element comprising a plurality of pixels,
   each of the plurality of pixels including:
   a photoelectric conversion layer that photoelectrically converts incident light;
   a signal reading circuit including an in-pixel transistor that is provided on a side opposite to a light incident side surface of the photoelectric conversion layer, amplifies signal charge generated by the photoelectric conversion layer, and reads the signal charge out of a pixel array; and
   a metal junction that bonds the photoelectric conversion layer and the signal reading circuit,
   the metal junction covering the in-pixel transistor when viewed from the light incident side surface of the photoelectric conversion layer.

2. The light receiving element according to claim 1, wherein the photoelectric conversion layer includes indium gallium arsenide (InGaAs).

3. The light receiving element according to claim 1, wherein the photoelectric conversion layer includes an organic film.

4. The light receiving element according to claim 1, wherein the photoelectric conversion layer includes germanium.

5. The light receiving element according to claim 1, wherein the photoelectric conversion layer includes silicon.

6. The light receiving element according to claim 1,
   wherein the signal reading circuit further includes a floating diffusion (FD) unit that accumulates signal charge generated by the photoelectric conversion layer, and
   the in-pixel transistor includes an amplifier transistor that amplifies a potential corresponding to an amount of signal charge accumulated in the FD unit and outputs a pixel signal corresponding to the potential that has been amplified.

7. The light receiving element according to claim 1, wherein the in-pixel transistor includes an amplifier transistor that amplifies a potential corresponding to an amount of signal charge generated by the photoelectric conversion layer and outputs a pixel signal corresponding to the potential that has been amplified, and a current source transistor that is connected between the amplifier transistor and ground, and the amplifier transistor and the current source transistor constitute a source follower amplifier circuit.

8. The light receiving element according to claim 1, wherein the in-pixel transistor constitutes a capacitive trans impedance amplifier (CTIA).

9. The light receiving element according to claim 1, wherein the metal junction includes Cu—Cu bonding.

10. The light receiving element according to claim 1, wherein the metal junction includes a bump.

11. An electronic apparatus comprising a light receiving element including a plurality of pixels,
    each of the plurality of pixels including:
    a photoelectric conversion layer that photoelectrically converts incident light;
    a signal reading circuit including an in-pixel transistor that is provided on a side opposite to a light incident side surface of the photoelectric conversion layer, amplifies signal charge generated by the photoelectric conversion layer, and reads the signal charge out of a pixel array; and
    a metal junction that bonds the photoelectric conversion layer and the signal reading circuit,
    the metal junction covering the in-pixel transistor when viewed from the light incident side surface of the photoelectric conversion layer.

* * * * *